(12) United States Patent
Oh et al.

(10) Patent No.: US 8,934,288 B2
(45) Date of Patent: Jan. 13, 2015

(54) MAGNETIC MEMORY DEVICES

(75) Inventors: Sechung Oh, Gyeonggi-do (KR);
Hyungrok Oh, Yongin-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 351 days.

(21) Appl. No.: 13/404,237

(22) Filed: Feb. 24, 2012

(65) Prior Publication Data

US 2012/0218813 A1    Aug. 30, 2012

(30) Foreign Application Priority Data

Feb. 25, 2011    (KR) .................. 10-2011-0017223

(51) Int. Cl.
*G11C 11/00*    (2006.01)
*G11C 11/16*    (2006.01)

(52) U.S. Cl.
CPC ........... *G11C 11/161* (2013.01); *Y10S 977/933* (2013.01); *Y10S 977/935* (2013.01)
USPC ........... 365/158; 365/148; 365/171; 977/933; 977/935

(58) Field of Classification Search
CPC ....................................................... G11C 11/00
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | |
|---|---|---|---|
| 6,924,520 B2 | 8/2005 | Park et al. | |
| 7,577,016 B2 | 8/2009 | Jeong et al. | |
| 8,199,562 B2 * | 6/2012 | Zhu et al. | 365/158 |
| 2011/0075471 A1 * | 3/2011 | Zhu et al. | 365/158 |

FOREIGN PATENT DOCUMENTS

| | | |
|---|---|---|
| JP | 2004228573 A | 8/2004 |
| KR | 100923298 B1 | 7/2004 |
| KR | 100558012 B1 | 1/2006 |
| KR | 100962949 B1 | 3/2010 |

* cited by examiner

*Primary Examiner* — Harry W Byrne
(74) *Attorney, Agent, or Firm* — Harness, Dickey & Pierce, P.L.C.

(57) ABSTRACT

Magnetic memory devices are provided, the devices include at least memory cell and a reference cell on a substrate. The memory cells include a first base magnetic layer, a free layer, and a first tunnel barrier layer between the first base magnetic layer and free layer. The reference memory cell includes a second base magnetic layer, a reference magnetic layer, and a second tunnel barrier layer between the second base magnetic layer and reference magnetic layer. The reference magnetic layer has a magnetic direction substantially perpendicular to that of the free layer.

14 Claims, 10 Drawing Sheets

US 8,934,288 B2

MAGNETIC MEMORY DEVICES

CROSS-REFERENCE TO RELATED APPLICATIONS

This U.S. non-provisional patent application claims priority under 35 U.S.C. §119 to Korean Patent Application No. 10-2011-0017223, filed on Feb. 25, 2011, the entire contents of which are hereby incorporated by reference.

BACKGROUND

1. Field

Example embodiments in the present disclosure herein relate to semiconductor memory devices, and more particularly, to magnetic memory devices.

2. Related Art

With electronic devices having higher speeds and lower consumption power, semiconductor memory devices built therein also require faster write/read operation and lower operation voltage. As a solution for satisfying such needs, magnetic memory devices have been proposed for use as semiconductor memory devices. Because magnetic memory devices can operate at high speeds and have non-volatile characteristics, it is anticipated that they will become the next-generation of memory devices.

In general, magnetic memory devices may include a magnetic tunnel junction (MTJ). The magnetic tunnel junction may include two magnetic materials and a tunnel barrier layer interposed therebetween. The resistance value of a magnetic tunnel junction may vary depending on the magnetization direction of the two magnetic materials. For example, the magnetic tunnel junction may have a relatively high resistance value in a case where the magnetization direction of the two magnetic materials are anti-parallel to each other, and have a relatively low resistance value in a case where the magnetization direction of the two magnetic materials are parallel. Magnetic memory devices can write/read data using the difference between such resistance values.

As the electronic industry becomes more highly advanced, requirements for high integration and/or low power consumption of magnetic memory devices are increasing. Accordingly, in order to satisfy such requirements, many studies are being conducted.

SUMMARY

Example embodiments in the present disclosure herein relate to semiconductor memory devices, and more particularly, to magnetic memory devices.

Other example embodiments of the present disclosure provide a reference cell for reading a memory cell. Example embodiments of the present disclosure also provide a method of forming a magnetic memory device used including a reference cell.

Example embodiments of the inventive concepts provide a magnetic memory device including at least one memory cell and a reference cell provided on a substrate. The at least one memory cell includes a first base magnetic layer, a free layer, and a first tunnel barrier layer between the first base magnetic layer and the free layer. The reference cell includes a second base magnetic layer, a reference magnetic layer, and a second tunnel barrier layer between the second base magnetic layer and the reference magnetic layer. The reference magnetic layer has a magnetization direction substantially perpendicular to that of the free layer.

In some example embodiments, the magnetization direction of the reference magnetic layer may be fixed in a direction substantially perpendicular to a magnetization easy-axis of the free layer when a read current is applied to the reference cell.

In other example embodiments, the first and second base magnetic layers may have a magnetization direction substantially parallel with a top surface of the first tunnel barrier layer and a top surface of the second tunnel barrier layer. The free layer may have a magnetization direction which changes to a direction parallel, or anti-parallel, with a magnetization direction of the first base magnetic layer and a magnetization direction of second base magnetic layer.

In still other example embodiments, the reference magnetic layer may have a magnetization direction substantially perpendicular to the top surface of the first tunnel barrier layer and the top surface of the second tunnel barrier layer.

In even other example embodiments, the reference magnetic layer may include the same material as the free layer. The reference magnetic layer may be thinner than the free layer.

In yet other example embodiments, the reference cell may include a non-magnetic metal oxide layer which is in contact with the reference magnetic layer.

In further example embodiments, the reference magnetic layer and the free layer may have the substantially same thickness.

In still further example embodiments, the non-magnetic metal oxide layer may include a nano-oxide layer having a thickness less than the second tunnel barrier layer.

In even further example embodiments, the reference magnetic layer may be provided below the second base magnetic layer. The reference cell may include a seed layer below the reference magnetic layer. The non-magnetic metal oxide layer may be provided between the seed layer and reference magnetic layer.

In yet further example embodiments, the first and second base magnetic layers may have a magnetization direction substantially perpendicular to a top surface of the first tunnel barrier layer and a top surface of the second tunnel barrier layer. The free layer may have a magnetization direction which changes to a direction parallel, or anti-parallel, with a magnetization direction of the first base magnetic layer and a magnetization direction of the second base magnetic layer.

In much further example embodiments, the reference magnetic layer may have a magnetization direction substantially parallel to the top surface of the first tunnel barrier layer and the top surface of the second tunnel barrier layer.

In still much further example embodiments, the reference magnetic layer may be thicker than the free layer.

In even much further example embodiments, the at least one memory cell may further include a non-magnetic metal oxide layer which is in contact with the free layer.

In yet much further example embodiments, the reference cell may be disposed on (or mounted on, or affixed to) the at least one memory cell (e.g., on an upper surface of the at least one memory cell).

In other example embodiments of the inventive concepts, a magnetic memory device includes at least one memory cell, and at least one reference cell. The at least one memory cell includes a first magnetic layer, a second magnetic layer, and a first tunnel barrier layer between the first magnetic layer and the second magnetic layer. The at least one reference cell includes a third magnetic layer, a fourth magnetic layer, and a second tunnel barrier layer between the third magnetic layer and the fourth magnetic layer. The second magnetic layer has a magnetic moment in a direction perpendicular to a magnetization direction of the fourth magnetic layer.

In other example embodiments, the reference cell has a magnetic tunnel junction. The magnetic tunnel junction may have a resistance greater than that of the at least one memory cell when the magnetization directions of the first magnetic layer and the second magnetic layer are parallel, and less than that of the at least one memory cell when the magnetization directions of the first magnetic layer and the second magnetic layer are anti-parallel.

According to example embodiments, a magnetic memory device includes at least one memory cell on a substrate, and at least one reference cell. The at least one reference cell includes a first magnetic tunnel junction ($MTJ_1$). The magnetic memory device is configured to use the at least one reference cell as a reference resistance without pre-writing.

In example embodiments, the at least one reference cell may include a layer having a magnetization direction that is orientated at a 90° angle with respect to that of the at least one memory cell.

In some example embodiments, the at least one memory cell may include a second magnetic tunnel junction ($MTJ_2$). A resistance of the $MTJ_1$ may be greater than that of the $MTJ_2$ when magnetic layers of $MTJ_2$ have magnetization directions parallel to each other.

In yet other example embodiments, the at least one reference cell may include a second magnetic tunnel junction ($MTJ_2$). A resistance of the $MTJ_1$ may be less than that of the $MTJ_2$ when magnetic layers of $MTJ_2$ have magnetization directions anti-parallel to each other.

BRIEF DESCRIPTION OF THE DRAWINGS

The accompanying drawings are included to provide a further understanding of the example embodiments of the inventive concepts, and are incorporated in and constitute a part of this specification. The drawings illustrate example embodiments of the inventive concepts and, together with the description, serve to explain principles of the inventive concepts. In the drawings.

DETAILED DESCRIPTION OF THE EMBODIMENTS

Figure 1:
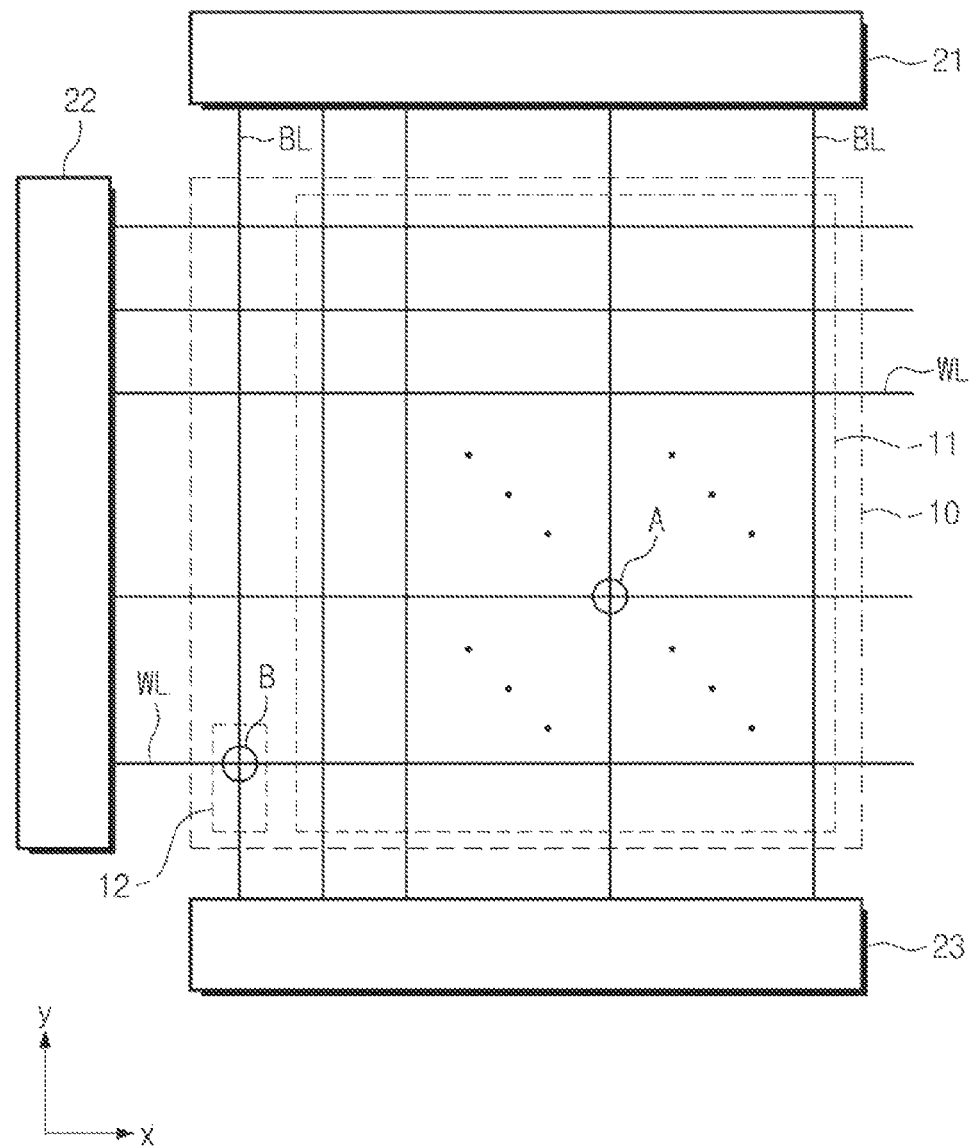
FIG. 1 is a schematic diagram illustrating a cell array of a magnetic memory device according to example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments in the present disclosure herein relate to semiconductor memory devices, and more particularly, to magnetic memory devices.

FIG. 1 is a schematic diagram illustrating a cell array of a magnetic memory device according to example embodiments of the inventive concepts.

In FIG. 1, for convenience, the cell array of the magnetic memory device is simply shown, but it is not limited thereto. Also, a relative ratio of respective elements may be exaggerated, or modified, for clarity of illustration.

Referring to FIG. 1, a cell array 10 of a magnetic memory device is provided. The cell array 10 may include a memory cell area 11 and a reference cell area 12. The memory cell area 11 may include a plurality of memory cells A. The memory cells A may be arranged in the x-direction and y-direction of the memory cell area 11. As an example, the memory cell area 11 may be configured with a plurality of memory cell strings.

The reference cell area 12 may be provided in the cell array 10. The reference cell area 12 may be disposed at one side of the memory cell area 11. As an example, the reference cell area 12 may be disposed at the same level (e.g., at the same height or provided on a same surface of a substrate) to be horizontally spaced apart from the memory cell area 11. In another example embodiments, the reference cell area 12 may be a portion of the memory cell area 11. That is, a portion of cells in the memory cell area 11 may be configured with a reference cell.

Word lines WL may be extended in the x-direction on the cell array 10, and bit lines BL may be extended in the y-direction on the cell array 10. On the memory cell area 11, the memory cells A may be disposed at a crossing point of the word lines WL and bit lines BL. On the reference cell area 12, a reference cell B may be disposed at a crossing point of the word lines WL and bit lines BL. The memory cells A may store a data according to a magnetization direction. The reference cell B may be a criterion of resistance states of the memory cells A. The reference cell B may be configured with (or as) one cell. In other embodiments, the reference cell B may be provided in plurality (e.g., a plurality of reference cells B), and the average value of the plurality of reference cells B may be a criterion of resistance states of the memory cells A. Hereinafter, the memory cells A and reference cell B will be described in detail with reference to FIGS. 2 to 6.

A row decode circuit 22 may be disposed at one end portion of the word lines WL, and a column decode circuit 21 may be disposed at one end portion of the bit lines BL. In a write operation, the row decode circuit 22 may apply a write current to selected word lines WL, and the column decode circuit 21 may apply a write current to selected bit lines BL.

In a read operation, a read circuit 23 sensing the resistance of a selected cell may be provided. The read circuit 23 may be provided at another end port of the bit lines BL. The read circuit 23 may include a plurality of sense amplifiers and a switch set connecting memory cells to the sense amplifiers.

Figure 2:
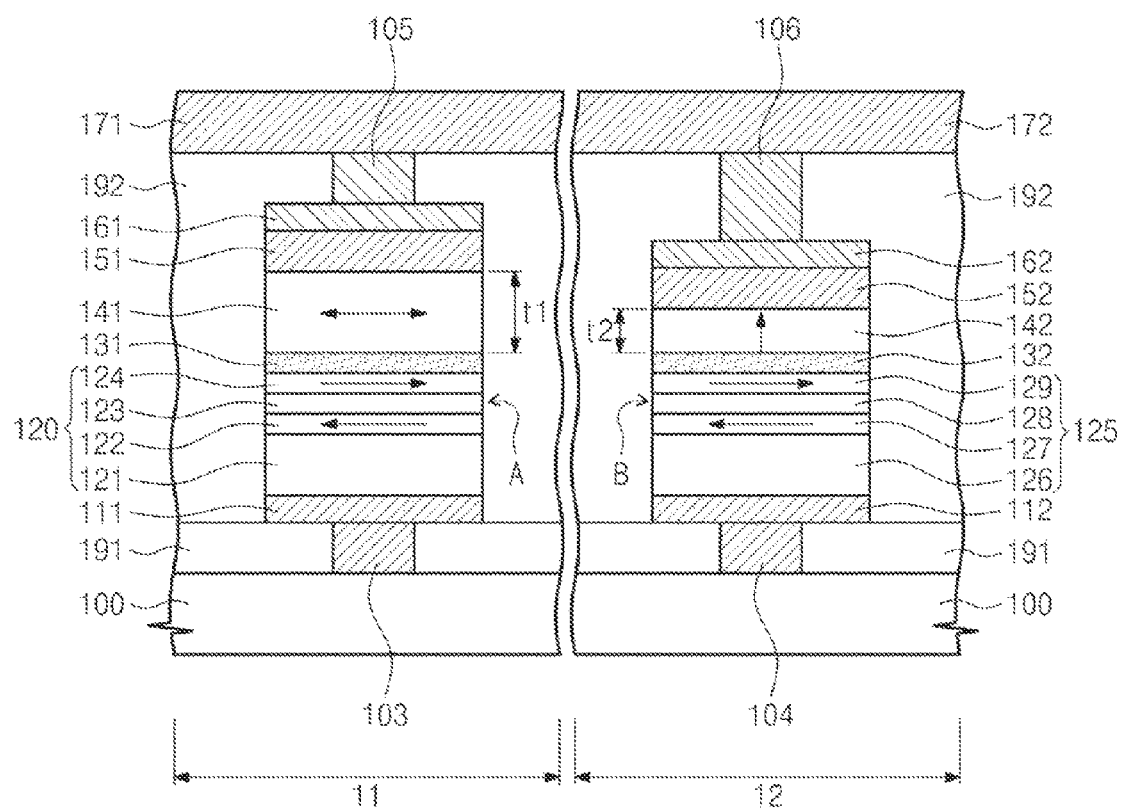
FIG. 2 is a sectional view of a magnetic memory device according to first example embodiments of the inventive concepts.

FIG. 2 is a sectional view of a magnetic memory device according to first example embodiments of the inventive concepts.

Referring to FIG. 2, at least one memory cell A and a reference cell B are provided on a substrate 100. The memory cells A may be provided in a memory cell area 11, and the reference cell B may be provided in a reference cell area 12. The substrate 100 may be one of a semiconductor material, an insulation material, and a semiconductor or a conductor covered with an insulation material. For example, the substrate 100 may be a silicon wafer. As an example, the substrate 100 may be an area doped with p-type impurities.

A first interlayer dielectric 191 may be disposed on the substrate 100. A switching device (not shown) may be disposed on the substrate 100. The switching device may be a field-effect transistor or a diode. The first interlayer dielectric 191 may be disposed over the substrate 100 including the switching device. Lower contact plugs 103 and 104 may be provided under the memory cells A and the reference cell B, and extend through the first interlayer dielectric 191. The lower contact plugs 103 and 104 may be electrically connected with one end of the switching device. The first interlayer dielectric 191 may include an oxide, nitride, and/or oxynitride. The lower contact plugs 103 and 104 may include at least one of a metal, a conductive metal nitride, a semiconductor-metal compound, and a semiconductor doped with a dopant.

The memory cell A may include a first base magnetic layer, a second magnetic layer, and a first tunnel barrier layer between the first and second magnetic layers. As an example, the memory cell A may include a first base magnetic layer 120, a free layer 141, and a first tunnel barrier layer 131 between the first base magnetic layer 120 and the free layer 141. The first base magnetic layer 120, the first tunnel barrier layer 131, and the free layer 141 may be configured as, or a part of, a Magnetic Tunnel Junction (MTJ).

The first base magnetic layer 120 may have a horizontal magnetization direction parallel with a top (or upper) surface of the first tunnel barrier layer 131. More specifically, the first base magnetic layer 120 may include a pinning layer 121, a first pinned layer 122, an exchange coupling layer 123, and a second pinned layer 124. The first pinned layer 122 may be disposed near the pinning layer 121, and between the pinning layer 121 and the second pinned layer 124. The exchange coupling layer 123 may be disposed between the first and second pinned layers 122 and 124. The second pinned layer 124 may be adjacent to the first tunnel barrier layer 131. That is, the second pinned layer 124 may be disposed between the first tunnel barrier layer 131 and the exchange coupling layer 123.

The pinning layer 121 may fix a magnetization direction of the first pinned layer 122 in one direction. The fixed magnetization direction of the first pinned layer 122 may be substantially parallel with the top (or upper) surface of the first tunnel barrier layer 131. The magnetization direction of the second pinned layer 124 may be fixed anti-parallel with that of the first pinned layer 122 by the exchange coupling layer 123.

The pinning layer 121 may include an anti-ferromagnetic material. For example, the pinning layer 121 may include at least one manganese-based compound selected from platinum-manganese (PtMn), iridium-manganese (IrMn), manganese oxide (MnO), manganese sulfate (MnS), manganese-tellurium (MnTe), manganese fluoride (MnF) and combinations thereof.

The first pinned layer 122 may include a ferromagnetic material. For example, the first pinned layer 122 may include at least one iron-based compound selected from cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), cobalt-iron-nickel (CoFeNi) and combinations thereof.

The second pinned layer 124 may include a first magnetic material. According to example embodiments of the inventive concepts, the first magnetic material of the second pinned layer 124 may include iron (Fe) and/or cobalt. For example, the first magnetic material of the second pinned layer 124 may include at least one iron-based compound selected from cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), cobalt-iron-nickel (CoFeNi) and combinations thereof. The cobalt-iron-terbium (CoFeTb) may have a terbium (Tb) ratio of less than about 10% to have a magnetization direction parallel with the top surface of the first tunnel barrier layer 131. Similarly, the cobalt-iron-gadolinium (CoFeGd) may have a gadolinium (Gd) ratio of less than about 10% to have a magnetization direction parallel with the top surface of the first tunnel barrier layer 131.

The exchange coupling layer 123 may include a rare metal. For example, the exchange coupling layer 123 may include at least one metal selected from ruthenium (Ru), iridium (Ir), rhodium (Rh) and combinations thereof.

The first tunnel barrier layer 131 may have a thickness less than a spin diffusion distance. The first tunnel barrier layer 131 may include an insulation material. For example, the first tunnel barrier layer 131 may include at least one oxide selected from magnesium oxide, titanium oxide, aluminum oxide, magnesium-zinc oxide, magnesium-boron oxide and combinations thereof.

The free layer 141 may have a changeable magnetization direction (i.e., not fixed). In a write operation, the magnetization direction of the free layer 141 may be changed to a direction parallel, or anti-parallel, with the magnetization direction of the second pinned layer 124. That is, a magnetization easy-axis of the free layer 141 may be parallel with the top surface of the first tunnel barrier layer 131. A write current passing through the first base magnetic layer 120, the first tunnel barrier layer 131, and the free layer 141 may be provided, and thus the magnetization of the free layer 141 may be changed. The magnetization direction of the free layer 141 may be changed by a spin torque of electrons in the write current.

As an example, when the magnetization direction of the free layer 141 is anti-parallel with that of the second pinned layer 124, a write current may be supplied from the free layer 141 to the first base magnetic layer 120. That is, the electrons in the write current may be supplied from the first base magnetic layer 120 to the free layer 141. The electrons in the write current may include major electrons and minor electrons. The major electrons may have spins parallel with the second pinned layer 124, and the minor electrons may have spins anti-parallel with the second pinned layer 124. The major electrons are accumulated in the free layer 141, and a spin torque of the accumulated major electrons may change the magnetization direction of the free layer 141 to be parallel with that of the second pinned layer 124.

According to other example embodiments, when the magnetization directions of the second pinned layer 124 and free layer 141 are parallel with each other, a write current may be supplied from the first base magnetic layer 120 to the free layer 141. That is, electrons in the write current are supplied from the free layer 141 to the first base magnetic layer 120. The minor electrons in the write current, which are anti-parallel with the magnetization direction of the second pinned layer 124, may be reflected by the magnetization direction of the second pinned layer 124, and the reflected minor electrons may be accumulated in the free layer 141. The magnetization direction of the free layer 141 may be changed by a spin torque of the accumulated minor electrons to be anti-parallel with that of the second pinned layer 124.

A minimum current density for changing the magnetization direction of the free layer 141 is defined as a critical current density. The free layer 141 may include a second magnetic material. According to example embodiments of the inventive concepts, the second magnetic material of the free layer 141 may include iron (Fe). For example, the second magnetic material of the free layer 141 may include at least one iron-based compound selected from cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), cobalt-iron-gadolinium (CoFeGd), cobalt-iron-nickel (CoFeNi) and combinations thereof. The cobalt-iron-terbium (CoFeTb) may have a terbium (Tb) ratio of less than about 10% so as to have a magnetization direction parallel with the top surface of the first tunnel barrier layer 131. Similarly, the cobalt-iron-gadolinium (CoFeGd) may have a gadolinium (Gd) ratio of less than about 10% so as to have a magnetization direction parallel with the top surface of the first tunnel barrier layer 131.

Capping layers 151 and 152 may be provided on the memory cells A and reference cell B, respectively. The capping layers 151 and 152 may be formed of a conductive material. For example, the capping layers 151 and 152 may include a metal. For example, the capping layers 151 and 152 may include at least one metal selected from ruthenium (Ru), tantalum (Ta), palladium (Pd), titanium (Ti), platinum (Pt), silver (Ag), gold (Au), copper (Cu) and combinations thereof.

A first electrode 111 may be disposed between the first base magnetic layer 120 and the first interlayer dielectric 191, and a second electrode 161 may be disposed on the capping layer 151. The first electrode 111 may be electrically connected to one end of the switching device through the lower contact plug 103. The first and second electrodes 111 and 161 may include a conductive material having a low reactivity. The first and second electrodes 111 and 161 may include a conductive metal nitride. For example, the first and second electrodes 111 and 161 may include at least one metal nitride selected from a titanium nitride, a tantalum nitride, a tungsten nitride, and a titanium aluminum nitride. The first and second electrodes 111 and 161 may be formed of the same material, or different materials. Similarly, a first electrode 112 may be disposed under the reference cell B, and a second electrode 162 may be disposed on the reference cell B.

The memory cells A and reference cell B may be provided in a second interlayer dielectric 192. The second interlayer dielectric 192 may be disposed on the first interlayer dielectric 191. In the memory cell area 111, an upper contact plug 105 may be connected to the second electrode 161. Similarly, in the reference cell area 12, an upper contact plug 106 may be connected to the second electrode 162.

A first wiring 171 and a second wiring 172 may be disposed on the second interlayer dielectric 192 and connected to the upper contact plugs 105 and 106, respectively. The wirings 171 and 172 may be bit lines. The upper contact plugs 105 and 106, and the wirings 171 and 172, may include at least one of a metal and a conductive metal nitride.

The reference cell B may include a third magnetic layer, a fourth magnetic layer, and a second tunnel barrier layer between the third magnetic layer and the fourth magnetic layer. As an example, the reference cell B may include a second base magnetic layer 125, a reference magnetic layer 142, and a second tunnel barrier layer 132 between the second base magnetic layer 125 and the reference magnetic layer 142. The second base magnetic layer 125, the second tunnel barrier layer 132, and the reference magnetic layer 142 may collectively be configured as, or a part of, a magnetic tunnel junction (MTJ).

The reference cell B may have the substantially same configuration as the memory cells A, except for the reference magnetic layer 142. As an example, the second base magnetic layer 125 may include a pinning layer 126, a first pinned layer 127, an exchange coupling layer 128, and a second pinned layer 129 identically to the first base magnetic layer 120. As an example, the second base magnetic layer 125 may have the same shape and thickness, and be formed of the same material, as the first base magnetic layer 120. Similarly, the second tunnel barrier layer 132 may have the same shape and thickness, and be formed of the same material, as the first tunnel barrier layer 131.

The memory cells A have different resistance values according to whether the magnetization direction of the first base magnetic layer 120 is parallel, or anti-parallel, with that of the free layer 141. As an example, the resistance (R+ΔR) of the memory cells A in a case where the first base magnetic layer 120 and the free layer 141 have anti-parallel magnetization directions may be greater than the resistance (R) of the memory cells A in a case where the first base magnetic layer 120 and the free layer 141 have parallel magnetization directions. In a read operation, the resistance states of the memory cells A may be measured so as to read data of the memory cells A with the median resistance value ($R_e$) of the R and R+ΔR. According to other example embodiments, the median current value ($I_e$) may be measured so as to read data of the memory cells A. To find the median resistance value ($R_e$), pre-writing in a plurality of cells and finding the average of the resistance value may be required.

In example embodiments of the inventive concepts, data of the memory cells A may be read on the basis of the resistance of the reference cell B. The reference magnetic layer 142 may have a magnetic moment in a direction perpendicular to a magnetization easy-axis of the free layer 141. As an example, the magnetization easy-axis of the free layer 141 may be parallel with the top surface of the first tunnel barrier layer 131, and the reference magnetic layer 142 may have a magnetic moment in a direction substantially perpendicular to the top surface of the second tunnel barrier layer 132. That is, the magnetization direction of the reference magnetic layer 142 may have a component in a direction substantially perpendicular to the top (or upper) surface of the second tunnel barrier layer 132. As an example, the magnetization direction of the reference magnetic layer 142 may be substantially perpendicular to the top surface of the second tunnel barrier layer 132.

The magnetization direction of the reference magnetic layer 142, when a read current is applied to the reference cell B, may be fixed in a direction substantially perpendicular to the top (or upper) surface of the second tunnel barrier layer 132. The read current may be substantially low compared to the write current. In FIG. 2, the magnetization direction of the reference magnetic layer 142 is indicated by an arrow directed away from the substrate 100 to the second tunnel barrier layer 132, but it may be in a reverse direction (i.e., from the second tunnel barrier layer 132 toward the substrate 100).

When the reference magnetic layer 142 has a magnetization direction substantially perpendicular to the top (or upper) surface of the second tunnel barrier layer 132, data of the memory cells A may be read by referencing the resistance of the reference cell B as the median resistance value ($R_e$). That is, when the reference magnetic layer 142 has a magnetization direction substantially perpendicular to the top (or upper) surface of the second tunnel barrier layer 132, the resistance of the reference cell B may have the median value of a resistance value in a case where the magnetizations of the first base magnetic layer 120 and free layer 141 are parallel, and a resistance value in a case where the magnetizations of the first base magnetic layer 120 and free layer 141 are anti-parallel. Accordingly, a process of determining the average of the resistance states of the memory cells, and a step of pre-writing in the memory cells to find a median value, are not required. Also, because the median resistance value ($R_e$) may be derived from one reference cell B, data may be read regardless of a resistance distribution of the cells according to a process margin. According to other example embodiments, a plurality of the reference cells B may be provided in the reference cell area 12, and an average resistance value of the plurality of reference cells may be used as the median resistance value ($R_e$).

In example embodiments of the inventive concepts, the reference magnetic layer 142 may include the same material as the free layer 141. As an example, the reference magnetic layer 142 may be formed of the same material as the free layer 141, but have a thickness different from that of the free layer 141. The thickness t2 of the reference magnetic layer 142 may be less than the thickness t1 of the free layer 141. As an example, the thickness t2 of the reference magnetic layer 142 may be about 40% to about 70% of the thickness t1 of the free layer 141. As an example, the reference magnetic layer 142 may have a thickness of about 8 Å (angstrom) to about 15 Å.

If the thickness t2 of the reference magnetic layer 142 is formed to be relatively less than that of the free layer 141, an interface magnetic anisotropy may increase, and thus the magnetization direction of the reference magnetic layer 142 may be substantially perpendicular to the top (or upper) surface of the second tunnel barrier layer 132. That is, materials for forming the free layer 141 and reference magnetic layer 142 may have a magnetic moment in a direction perpendicular to the top (or upper) surface of the first tunnel barrier layer 131 under a certain (or selected) thickness. The materials for forming the free layer 141 and reference magnetic layer 142 may have a magnetic moment in a direction perpendicular to the top (or upper) surface of the first tunnel barrier layer 131 until before the certain thickness is reached. When the certain thickness is exceeded, the materials for forming the free layer 141 and reference magnetic layer 142 may have a magnetic moment in a direction parallel with the top (or upper) surface of the first tunnel barrier layer 131. That is, the materials for forming the free layer 141 and reference magnetic layer 142 may have a perpendicular magnetization direction when their thicknesses are greater than a critical thickness, and may have a horizontal magnetization direction when their thicknesses are less than the critical thickness. Accordingly, the free layer 141 and reference magnetic layer 142 may be formed of the same material, but have different magnetization directions by making their thicknesses different.

The thickness difference of the reference magnetic layer 142 and free layer 141 may be implemented in various methods. As an example, when the memory cells A and the reference cell B are implemented on the same plane as illustrated in FIG. 1, the reference magnetic layer 142 and free layer 141 may be deposited at the same thickness using the same magnetic material, and then an upper portion of the magnetic material for forming the reference cell B may be removed. According to other example embodiments, the reference magnetic layer 142 and free layer 141 may be formed through a plurality of processes of depositing the same material on the memory cell area 11 and reference cell area 12 at different thicknesses, respectively. Processes of forming other elements except the reference magnetic layer 142 and free layer 141 may proceed simultaneously in the memory cell area 11 and reference cell area 12.

In these example embodiments, the free layer 141 and reference magnetic layer 142 are described as being formed of the same material, but they are not limited thereto. In example embodiments, the free layer 141 and reference magnetic layer 142 may be formed of different materials having a magnetization direction substantially perpendicular to each other.

Figure 3:
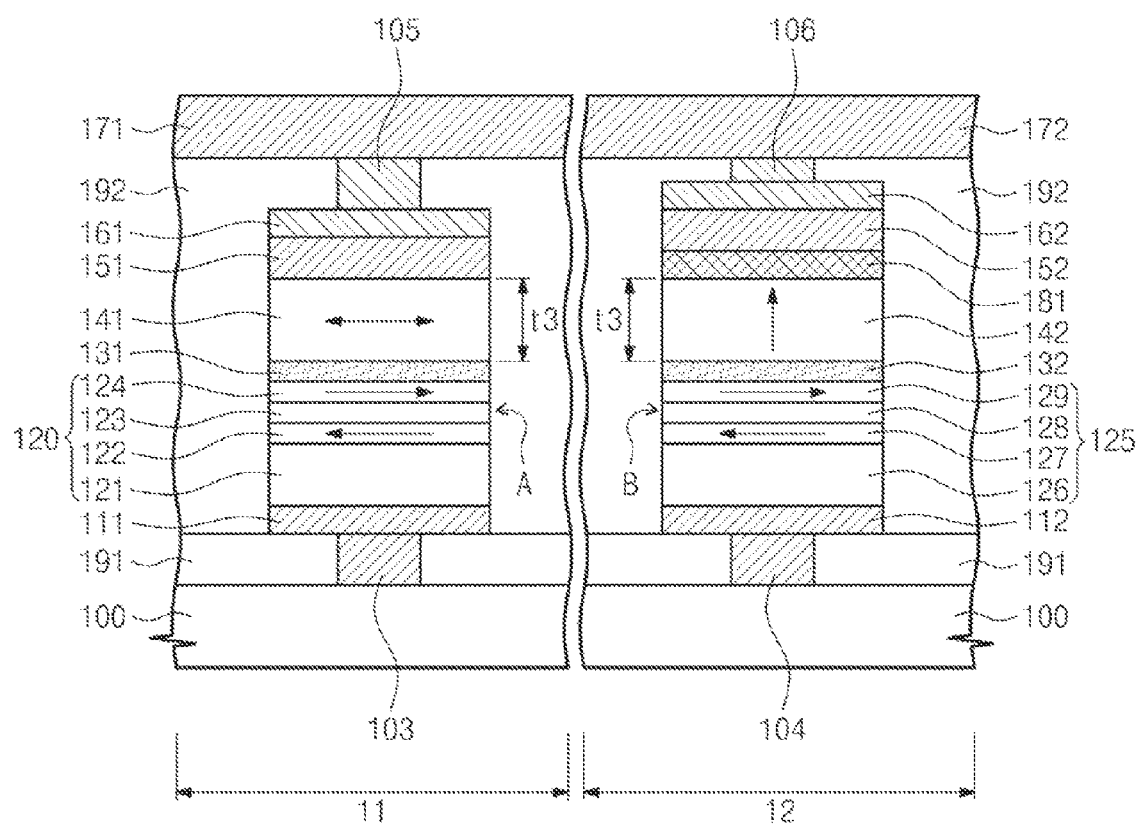
FIG. 3 is a sectional view illustrating a magnetic memory device according to second example embodiments of the inventive concepts.

FIG. 3 is a sectional view illustrating a magnetic memory device according to second example embodiments of the inventive concepts.

For convenience, repetitive description of the same elements may be omitted for the sake of brevity.

Referring to FIG. 3, at least one memory cell A and a reference cell B are provided on a substrate 100. The memory cells A may be provided in the memory cell area 11, and the reference cell B may be provided in the reference cell area 12. The memory cell A may include a first base magnetic layer 120, a free layer 141, and a first tunnel barrier layer 131 between the first base magnetic layer 120 and the free layer 141. The first base magnetic layer 120, the first tunnel barrier layer 131, and the free layer 141 may be configured as, or a part of, a magnetic tunnel junction (MTJ). The first base magnetic layer 120 may have a horizontal magnetization direction fixed in one direction, and parallel with the top (or upper) surface of the substrate 100. More specifically, the first base magnetic layer 120 may have a pinning layer 121, a first pinned layer 122, an exchange coupling layer 123, and a second pinned layer 124. The fixed magnetization direction of the first pinned layer 122 may be parallel with the top surface of the first tunnel barrier layer 131. The magnetization direction of the second pinned layer 124 may be fixed anti-parallel with that of the first pinned layer 122 by the exchange coupling layer 123.

The reference cell B may include a second base magnetic layer 125, a reference magnetic layer 142, and a second tunnel barrier layer 132 between the second base magnetic layer 125 and the reference magnetic layer 142. The second base magnetic layer 125, the second tunnel barrier layer 132, and the reference layer 142 may be configured as, or a part of, a magnetic tunnel junction (MTJ). The second base magnetic layer 125 may have a pinning layer 126, a first pinned layer 127, an exchange coupling layer 128, and a second pinned layer 129, identical to the first base magnetic layer 120.

A non-magnetic metal oxide layer 181 may be provided between the reference magnetic layer 142 and a capping layer 152. The non-magnetic metal oxide layer 181 may contact the reference magnetic layer 142. According to example embodiments of the inventive concepts, the non-magnetic metal oxide layer 181 may be disposed on the reference magnetic layer 142. The non-magnetic metal oxide layer 181 may include a non-magnetic metal and oxygen. The non-magnetic metal oxide layer 181 may include a nano-oxide layer having a thickness less than the second tunnel barrier layer 132. The nano-oxide layer may be a monolayer, or include multiple layers. The nano-oxide layer may have a thickness that ranges from about 1 nanometer to less than about 20 angstroms. For example, the nano-oxide layer may include $Fe_3O_4$, $CrO_2$, or CoFeO. According to example embodiments of the inventive concepts, the non-magnetic metal oxide layer 181 may be thinner than the second tunnel barrier layer 132. As an example, the resistance value of the non-magnetic metal oxide layer 181 may be equal to, or less than, 30% of that of the second tunnel barrier layer 132. According to other example embodiments of the inventive concepts, an oxygen ratio in a metal oxide where the non-magnetic metal is rich may be lower than a stoichiometry ratio. That is, although being an oxide, the non-magnetic metal oxide layer 181 may have a low resistivity. A concentration of the non-magnetic metal in the non-magnetic metal oxide layer 181 may be substantially conformal in the entirety of the non-magnetic metal oxide layer 181. Thus, the resistivity of the non-magnetic metal oxide layer 181 may be conformal, thereby decreasing the entire resistance of the non-magnetic metal layer 181.

As an example, the non-magnetic metal layer 181 may provide a stress to the reference magnetic layer 142 in a direction parallel with the top (or upper) surface of the reference magnetic layer 142. The stress may be a compressive force, or a tensile force. Thus, atom magnetic moments which are anti-parallel with the top surface of the second tunnel barrier layer 132 may increase in the reference magnetic layer 142. That is, the magnetization direction of the reference magnetic layer 142 may have a component in a direction perpendicular to the top surface of the second tunnel barrier layer 132. As an example, even when the thickness t3 of the reference layer 142 is equal to the thickness t3 of the free layer 141, the reference magnetic layer 142 may have a magnetization direction substantially perpendicular to the top surface of the second tunnel barrier layer 132 due to the non-magnetic metal oxide layer 181.

According to example embodiments of the inventive concepts, the non-magnetic metal oxide layer 181 may have a thickness of about 2 Å to about 20 Å. According to example embodiments of the inventive concepts, the non-magnetic metal oxide layer 181 may be in an amorphous state. According to example embodiments of the inventive concepts, the non-magnetic metal oxide layer 181 may include at least one of a hafnium-rich hafnium oxide, a tantalum-rich tantalum oxide, a zirconium-rich zirconium oxide, a chromium-rich chromium oxide, a vanadium-rich vanadium oxide, a molybdenum-rich molybdenum oxide, a titanium-rich titanium oxide, a tungsten-rich tungsten oxide, a yttrium-rich yttrium oxide, a magnesium-rich magnesium oxide, and a zinc-rich zinc oxide.

According to these example embodiments, even when formed of the same material and thickness, the free layer 141 and reference magnetic layer 142 may have different magnetization directions due to the presence of the non-magnetic metal oxide layer 181. That is, even when the reference magnetic layer 142 may be formed to have the same thickness as the free layer 141, the magnetization directions of the memory cells A and reference cell B may be formed to be substantially perpendicular to each other. Thus, the resistance of the reference cell B may have the median value of the resistance value in a case where the magnetization directions of the first base magnetic layer 120 and free layer 141 are parallel, and the resistance value in a case where the magnetization directions of the first base magnetic layer 120 and free layer 141 are anti-parallel.

When the reference magnetic layer 142 and free layer 141 are formed to have the same thickness, the reference magnetic layer 142 and free layer 141 may be simultaneously formed of the same material. In these example embodiments, it is described that the free layer 141 and reference magnetic layer 142 may have the same material and thickness, but they are not limited thereto. In other example embodiments of the inventive concepts, the free layer 141 and reference magnetic layer 142 may be formed through a plurality of deposition processes of different materials, respectively.

Figure 4:
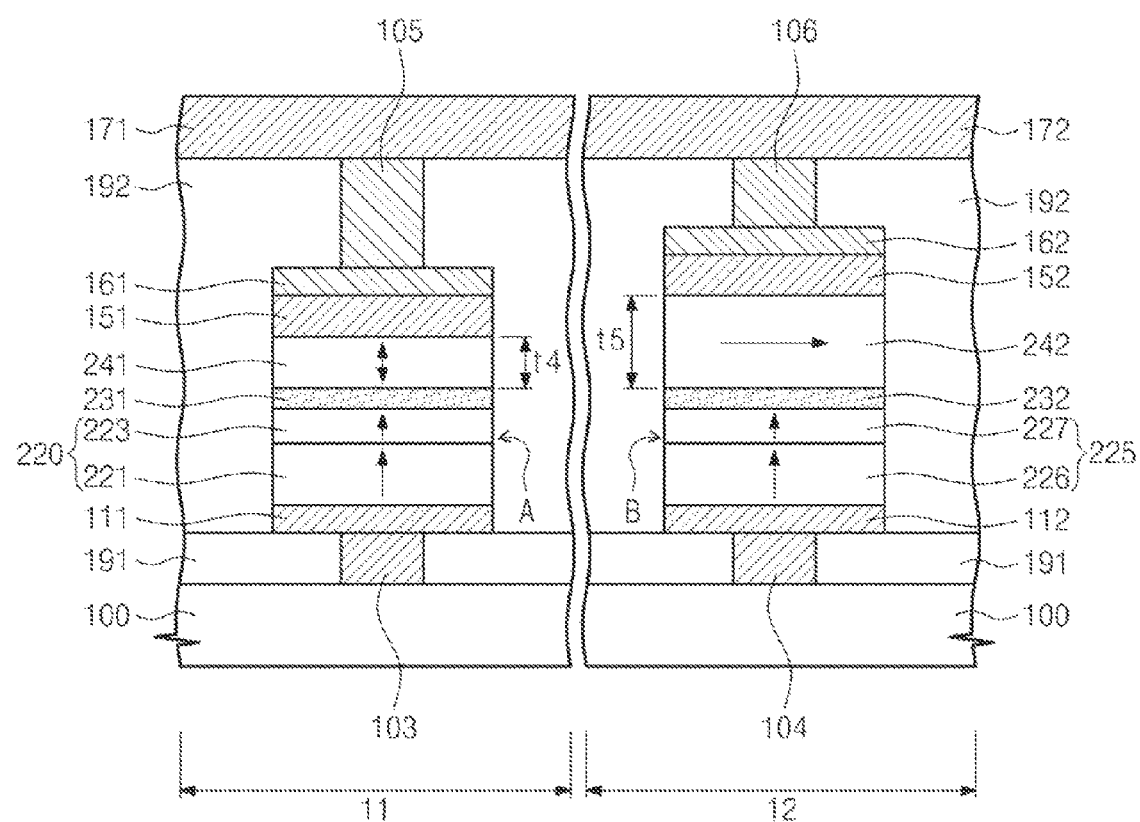
FIG. 4 is a sectional view illustrating a magnetic memory device according to third example embodiments of the inventive concepts.

FIG. 4 is a sectional view illustrating a magnetic memory device according to third example embodiments of the inventive concepts.

For simplification, repetitive description of the same elements may be omitted for the sake of brevity.

Referring to FIG. 4, at least one memory cell A and a reference cell B are provided on a substrate 100. The memory cells A may be provided in a memory cell area 11, and the reference cell B may be provided in a reference cell area 12.

The memory cells A may include a first base magnetic layer 220, a first tunnel barrier layer 231, and a free layer 241. The first base magnetic layer 220 may include a fixed perpendicular magnetic layer 221 and a spin polarization pattern 223. The fixed perpendicular magnetic layer 221 may have a magnetization direction substantially perpendicular to the top surface of the first tunnel barrier layer 231. For example, the fixed perpendicular magnetic layer 221 may include at least one of CoFeTb, CoFeGd, CoFeDy, a perpendicular magnetic material having an $L1_0$ structure, CoPt with a hexagonal close packed lattice structure, or a compound metal including the same. The perpendicular magnetic material with the $L1_0$ structure may include at least one of FePt, FePd, CoPd, and CoPt with the $L1_0$ structure. According to example embodiments of the inventive concepts, the fixed perpendicular magnetic layer 221 may include a perpendicular magnetic structure having magnetic and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (n is the number of stacks).

The spin polarization pattern 223 may be disposed between the fixed perpendicular magnetic layer 221 and the first tunnel barrier layer 231. According to example embodiments of the inventive concepts, the spin polarization pattern 223 may contact the fixed perpendicular magnetic layer 221 and first tunnel barrier layer 231. The spin polarization pattern 223 may include a magnetic material. The spin polarization pattern 223 may have a magnetization direction parallel with the fixed perpendicular magnetic layer 221. That is, the spin polarization pattern 223 may have a magnetization direction substantially perpendicular to the top surface of the first tunnel barrier layer 231.

The spin polarization pattern 223 may include at least one iron-based compound selected from CoFeB, CoFe, NiFe, CoFePt, CoFePd, CoFeCr, CoFeTb, CoFeGd, CoFeNi and combinations thereof. When the spin polarization pattern 223 includes iron and cobalt, an iron ratio in the spin polarization pattern 223 may be greater than a cobalt ratio in the spin polarization pattern 223.

The first tunnel barrier layer 231 may have a thickness less than the spin diffusion distance. The first tunnel barrier layer 231 may include an insulation material. For example, the first tunnel barrier layer 231 may include at least one oxide selected from magnesium oxide, titanium oxide, aluminum oxide, magnesium-zinc oxide, and magnesium-boron oxide.

The free layer 241 may include a magnetic material. For example, the free layer 241 may include at least one iron-based compound selected from CoFeB, CoFe, NiFe, CoFePt, CoFePd, CoFeCr, CoFeTb, CoFeGd, CoFeNi and combinations thereof. The magnetization direction of the free layer 241 may be parallel, or anti-parallel, with that of the spin polarization layer 223.

The reference cell B may include a second base magnetic layer 225, a second tunnel barrier layer 232, and a reference magnetic layer 242. The second base magnetic layer 225 may include a fixed perpendicular magnetic layer 226 and a spin polarization pattern 227. The reference cell B may have the same structure as the memory cells A, with the exception of the reference magnetic layer 242. As an example, the second base magnetic layer 225 may be formed of the same material as the first base magnetic layer 220.

As an example, the reference magnetic layer 242 may be formed of the same material as the free layer 241, and the thickness t5 of the reference magnetic layer 242 may be greater than the thickness t4 of the free layer 241. The free layer 241 may have a thickness relatively less than the reference magnetic layer 242 to have a magnetization direction perpendicular to the top surface of the first tunnel barrier layer 231. As an example, the free layer 241 may have a thickness of about 10 Å to about 20 Å. The reference magnetic layer 242 may be formed to be thicker than the free layer 241 to have a magnetization direction parallel with the top surface of the second tunnel barrier layer 232. As an example, the thickness t5 of the reference magnetic layer 242 is about 130% to about 160% of the thickness t4 of the free layer 241.

In example embodiments, the free layer 241 and the reference magnetic layer 242 may be formed of the same material but have different thicknesses in order to have different magnetization directions. The thickness difference between the reference magnetic layer 242 and the free layer 241 may be implemented in various methods. As an example, when the memory cells A and the reference cell B are implemented on the same plane as illustrated in FIG. 1, the reference magnetic layer 242 and the free layer 241 may be formed of the same magnetic material and to have the same thickness, and then an upper portion of the magnetic material for configuring the memory cells A may be removed. According to other example embodiments, the reference magnetic layer 242 and the free layer 241 may be formed through a plurality of processes that deposit the same magnetic material to different thicknesses. Processes for forming elements other than the reference magnetic layer 142 and the free layer 141 may progress simultaneously in the memory cell area 11 and the reference cell area 12.

In these example embodiments, it is described that the free layer 241 and the reference magnetic layer 242 may be formed of the same material, but they are not limited thereto. In other example embodiments of the inventive concepts, the free layer 241 and the reference magnetic layer 242 may be formed of different materials having magnetization directions substantially perpendicular to each other, respectively.

Figure 5:
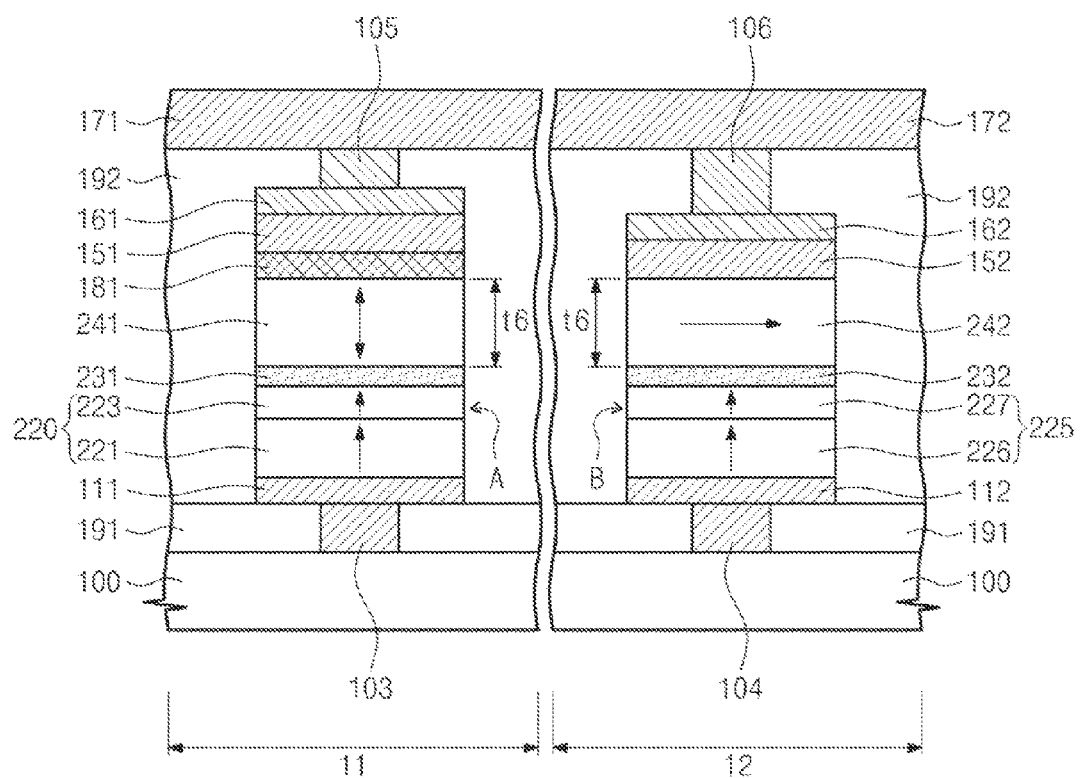
FIG. 5 is a sectional view illustrating a magnetic memory device according to fourth example embodiments of the inventive concepts.

FIG. 5 is a sectional view illustrating a magnetic memory device according to fourth example embodiments of the inventive concepts.

For simplification, repetitive description of the same elements will be omitted for the sake of brevity.

Referring to FIG. 5, at least one memory cell A and a reference cell B are provided on a substrate 100. The memory cells A may be provided in a memory cell area 11, and the reference cell B may be provided in a reference cell area 12. The memory cells A may include a first base magnetic layer 220, a first tunnel barrier layer 231, and a free layer 241. The first base reference magnetic layer 220 may include a fixed perpendicular magnetic layer 221 and a spin polarization layer 223. The fixed perpendicular magnetic layer 221 may have a magnetization direction substantially perpendicular to the top (or upper) surface of the first tunnel barrier layer 231. The spin polarization pattern 223 may contact the fixed perpendicular magnetic layer 221 and the first tunnel barrier layer 231. The spin polarization pattern 223 may have a magnetization direction parallel with the fixed perpendicular magnetic layer 221. That is, the spin polarization pattern 223 may have a magnetization direction substantially perpendicular to the top surface of the first tunnel barrier layer 231. The free layer 241 may have a magnetization direction parallel, or anti-parallel, with the spin polarization pattern 223.

The reference cell B may include a second base magnetic layer 225, a second tunnel barrier layer 232, and a reference magnetic layer 242. The second base magnetic layer 225 may include a fixed perpendicular magnetic layer 226 and a spin polarization pattern 227.

When the free layer 241 and the reference magnetic layer 242 are formed to be thin, an interface magnetic anisotropy decreases. Thus, the magnetization directions of the free layer 241 and the reference magnetic layer 242 may be substantially perpendicular to a top surface of the first barrier layer 231 and a top surface of the second tunnel barrier layer 232. The memory cells A may further include a non-magnetic metal oxide layer 181 between the free layer 241 and a capping layer 151. The non-magnetic metal oxide layer 181 may contact the free layer 241. According to example embodiments of the inventive concepts, the non-magnetic metal oxide layer 181 may be disposed on the free layer 241. The non-magnetic metal oxide layer 181 may include a non-magnetic metal and oxygen. As an example, the non-magnetic metal oxide layer 181 may provide a stress to the free layer 241 in a direction parallel with the top surface of the free layer 241. The stress may be a compressive force, or tensile force. Thus, atom magnetic moments, which are anti-parallel with the top surface of the first tunnel barrier layer 231, may increase in the free layer 241. That is, the magnetization direction of the free layer 241 may have a component in a direction perpendicular to the top surface of the first tunnel barrier layer 231. As an example, even when the thickness t6 of the reference layer 142 is equal to the thickness t6 of the free layer 141, the free layer 241 may have a magnetization direction substantially perpendicular to the top surface of the first tunnel barrier layer 231 due to the presence of the non-magnetic metal oxide layer 181.

In these example embodiments, even when formed of the same material and having the same thickness, the free layer 241 and the reference magnetic layer 242 may have different magnetization directions due to the non-magnetic metal oxide layer 181. That is, even when the reference magnetic layer 242 may be formed to have the same thickness as the free layer 241, the magnetization directions of the memory cells A and the reference cell B may be formed to be substantially perpendicular to each other. Thus, the resistance of the reference cell B may have the median value of the resistance value in a case where the magnetization directions of the first base magnetic layer 220 and the free layer 241 are parallel, and the resistance value in a case where the magnetization directions of the first base magnetic layer 220 and the free layer 241 are anti-parallel.

When the reference magnetic layer 242 and the free layer 241 are formed to have the same thickness, the reference magnetic layer 242 and the free layer 241 may be simultaneously formed of the same material. In these example embodiments, it is described that the free layer 241 and the reference magnetic layer 242 may have the same material and thickness, but they are not limited thereto. In other example embodiments of the inventive concepts, the free layer 241 and the reference magnetic layer 242 may be formed through a plurality of deposition processes of different materials.

Figure 6:
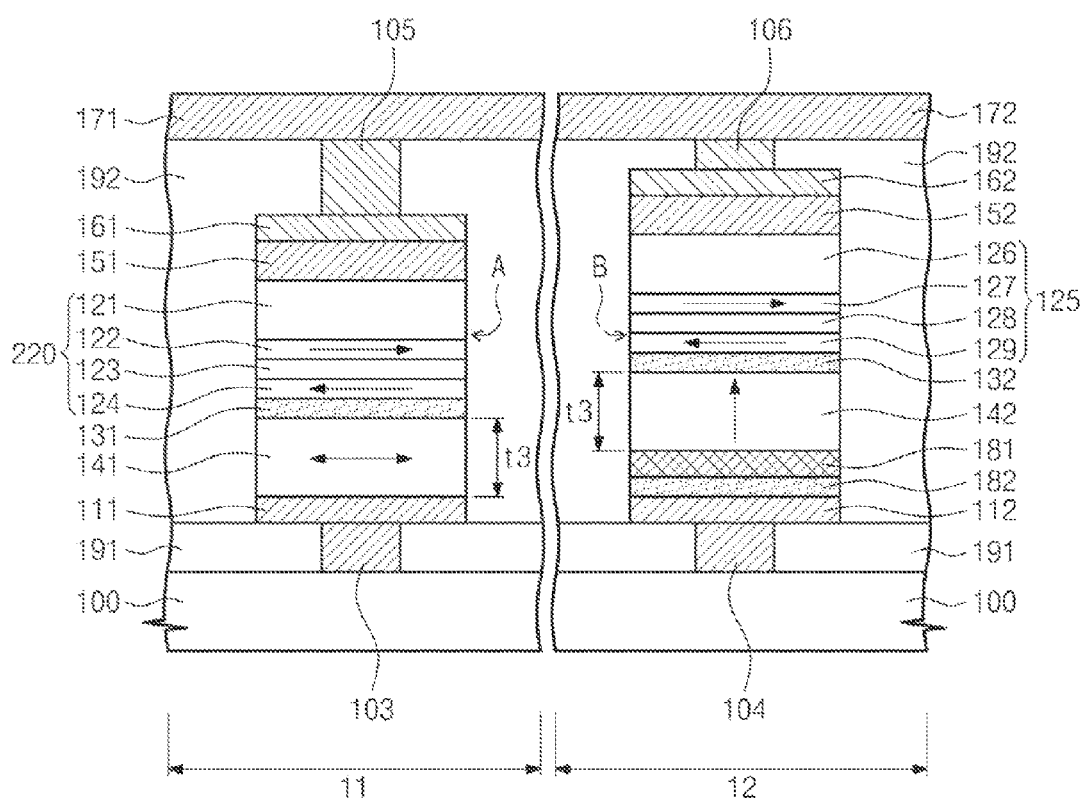
FIG. 6 is a sectional view illustrating a modified example of the first to fourth example embodiments.

FIG. 6 is a sectional view illustrating a modified example of the first to fourth example embodiments.

For simplification, the modified example will be described on the basis of the second example embodiments shown in FIG. 3. However, the first, third, and fourth example embodiments, which are described with reference to FIGS. 2, 4, and 5, respectively, may also be modified in the same manner.

Referring to FIG. 6, at least one memory cell A and a reference cell B are provided on a substrate 100. The memory cells A may be provided in a memory cell area 11, and the reference cell B may be provided in a reference cell area 12. The memory cells A and reference cell B may be similar to those in the second example embodiments described with reference to FIG. 3, but different in the stacked order of some layers. As an example, the some layers may be stacked in reverse order. That is, the memory cells A may include a free layer 141, a first tunnel barrier layer 131, and a first base magnetic layer 120 sequentially stacked on the substrate 100. The memory cells A in these example embodiments may be the same as those of FIG. 3 other than the stacked order.

The reference cell B may include a non-magnetic metal oxide layer 181, a reference magnetic layer 142, a second tunnel barrier layer 132, and a second base magnetic layer 125 sequentially stacked on the substrate 100. The stacked order of the reference cell B may be contrary to that of the reference cell described with reference to FIG. 3.

The reference cell B may further include a seed layer 182 between a first electrode 112 and the reference magnetic layer 142. The seed layer 182 may include at least one of palladium (Pd), platinum (Pt), a chromium ruthenium (CrRu) alloy, nickel (Ni), ruthenium (Ru), titanium (Ti), and titanium nitride (TiN). The palladium (Pd), the platinum (Pt), and the chromium ruthenium (CrRu) alloy may have a crystal growing plane of {111} or {000} (for example, with respect to the upper surface of the first electrode 112). The seed layer 182 may be formed below about 10 Å. The non-magnetic metal oxide layer 181 may be provided between the reference magnetic layer 142 and the seed layer 182.

Figure 7:
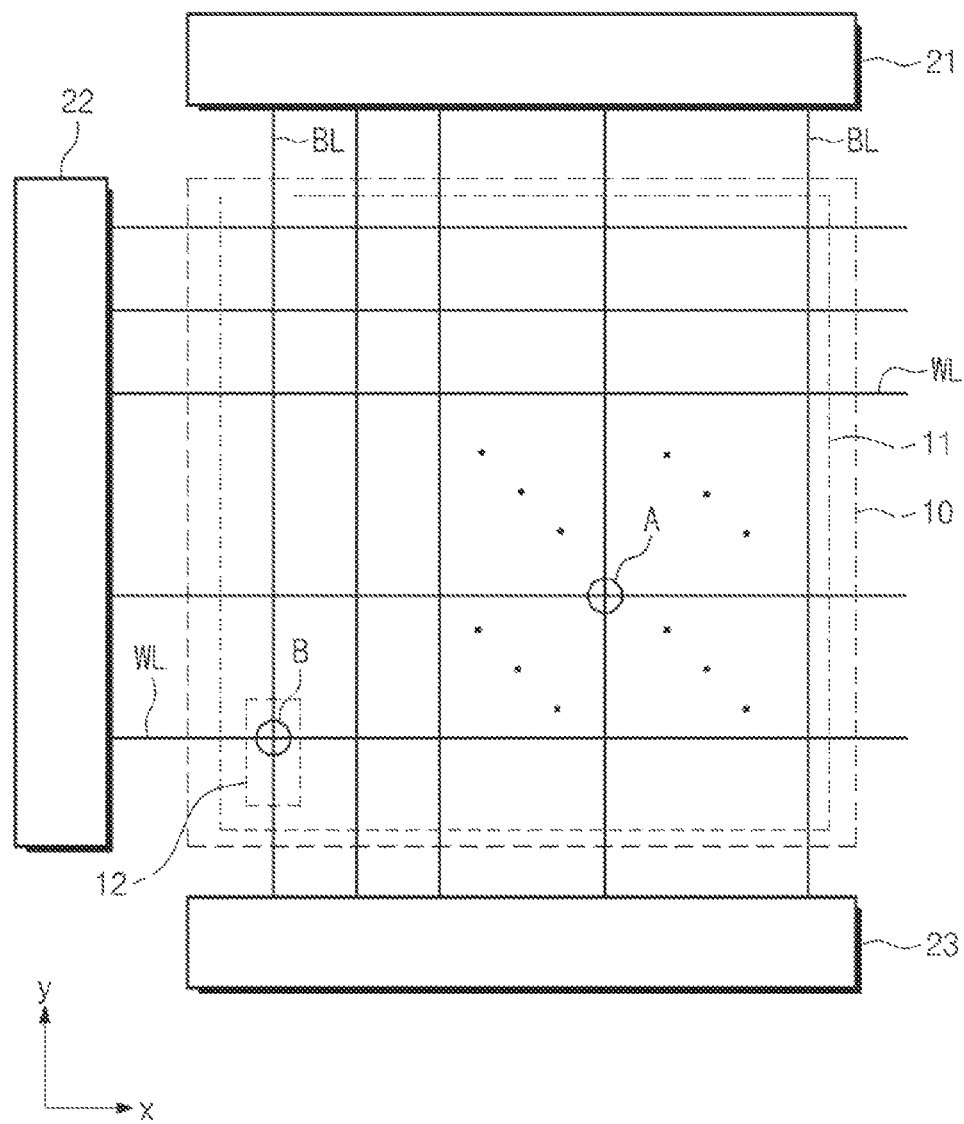
FIGS. 7 and 8 are diagrams illustrating another modified example of the first to fourth example embodiments.
Figure 8:
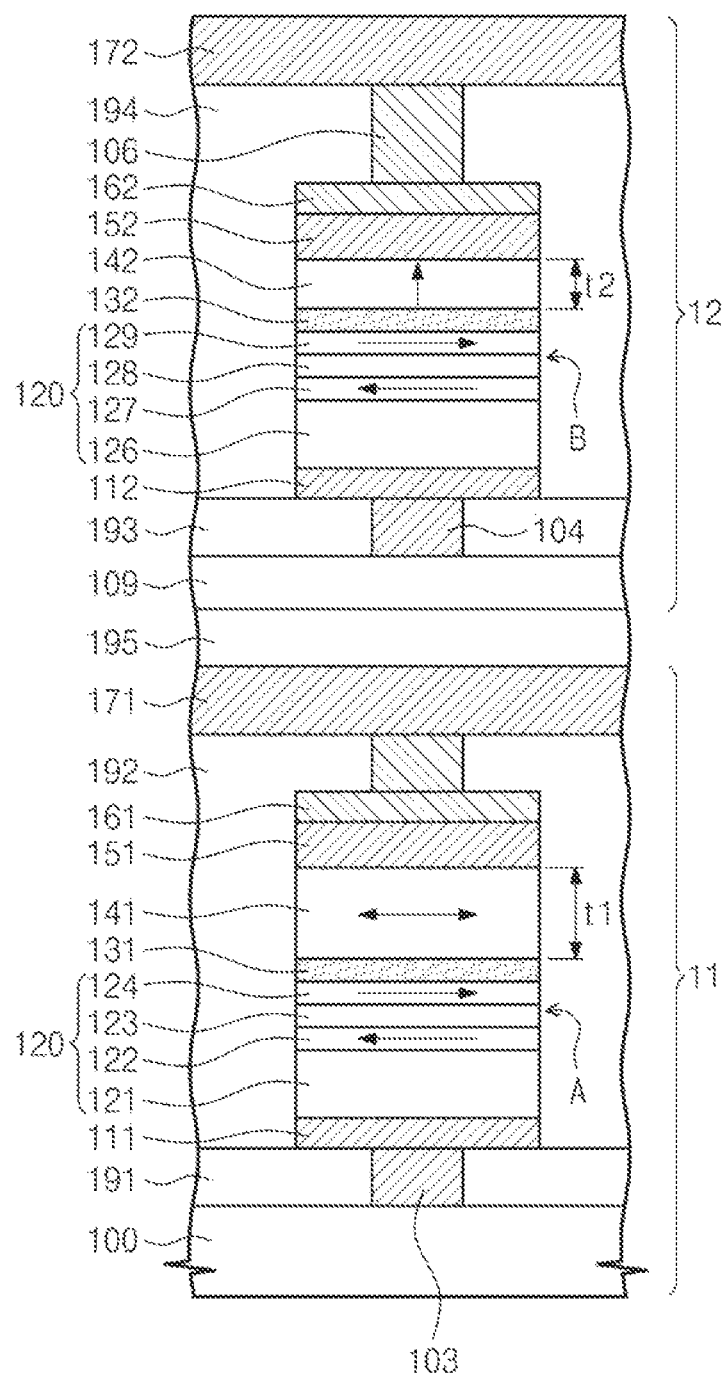

FIGS. 7 and 8 are diagrams illustrating another modified example of the first to fourth example embodiments.

For simplification, the modified example will be described on the basis of the first example embodiments shown in FIG. 2. However, the second to fourth example embodiments, which are described with reference to FIGS. 3 to 5, respectively, may also be modified in the same manner.

Referring to FIGS. 7 and 8, a reference cell area 12 may be provided on a memory cell area 11. The memory cells A may be provided in the memory cell area 11 and have the same configuration as the memory cell of FIG. 2. The reference cell B may be provided in the reference cell area 12, and have the substantially same configuration as the reference cell of FIG.

2. The reference cell B may be electrically connected to a semiconductor layer 109 (shown in FIG. 8). The reference cell B may be provided in a fourth interlayer dielectric 194, and electrically connected to a lower contact plug 104 provided in a third interlayer dielectric 193. A switching device (not shown) may be provided between the semiconductor layer 109 and lower contact plug 104. The reference cell area 12 may be electrically (and/or physically) spaced apart from the memory cell area 11 by a fifth interlayer dielectric 195.

In these example embodiments, the reference cell area 12 may be vertically stacked on the memory cell area 11, or vice versa. The reference cell area 12 for configuring a portion of a multi-level cell array may be electrically connected to a row decode circuit 22, a column decode circuit 21, and a read circuit 23 through a separate bit line and word line.

The magnetic memory devices disclosed in the above example embodiments may be implemented in various types of semiconductor package. For example, the magnetic memory devices according to example embodiments of the inventive concepts may be packaged in a method of forming, for example, a package on package (POP), ball grid arrays (BGAs), chip scale packages (CSPs), a plastic leaded chip carrier (PLCC), a plastic dual in-line package (PDIP), a die in a waffle pack, a die in a wafer form, a chip on board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), and a wafer-level processed stack package (WSP). The package having a magnetic memory device according to example embodiments of the inventive concepts mounted thereon may further include a logic device and/or controller controlling the magnetic memory device.

Figure 9:
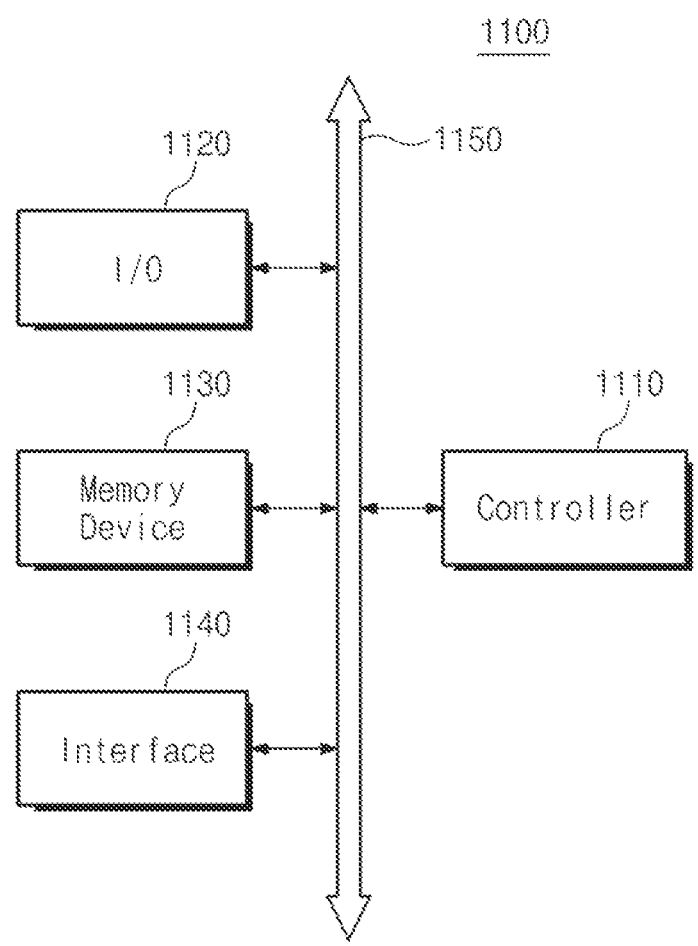
FIG. 9 is a block diagram showing an example of an electronic system including a magnetic memory device according to example embodiments of the inventive concepts.

FIG. 9 is a block diagram briefly showing an example of an electronic system including a magnetic memory device according to example embodiments of the inventive concepts.

Referring to FIG. 9, an electronic system 1100 according to example embodiments of the inventive concepts may include a controller 1110, an input/output device (I/O) (1120), a memory device 1130, an interface 1140, and a bus 1150. The controller 1110, the input/output device 1120, the memory device 1130, and/or the interface 1140 may be coupled to each other through the bus 1150. The bus 1150 is a path through which data is moved.

The controller 1110 may include at least one of a microcontroller, a digital signal processor, a microcontroller, and logic devices for performing the function similar thereto. The input/output device 1120 may include a keypad, a keyboard, and a display device. The memory device 1130 may store data and/or instruction. The memory device 1130 may include at least one of the magnetic memory devices disclosed in the above example embodiments of the inventive concepts. Also, the memory device 1130 may further include a different type of semiconductor memory device (e.g., a flash memory device, a phase-change memory device, a dynamic random access memory (DRAM), and/or a static random access memory (SRAM)). The interface 1140 may perform a function of transmitting/receiving data from/to a communication network. The interface 1140 may be wired or wireless. For example, the interface 1140 may include an antenna, or wired or wireless transceiver. Although not shown, the electronic system 1100 may further include a high speed DRAM device and/or SRAM device as an operation memory device for enhancing the operation of the controller 1110.

The electronic system 1100 may be applied to a personal digital assistant (PDA), a portable computer, a web tablet, a wireless phone, a mobile phone, a digital music player, a memory card, or all electronic products for transmitting/receiving information in wireless environments.

Figure 10:
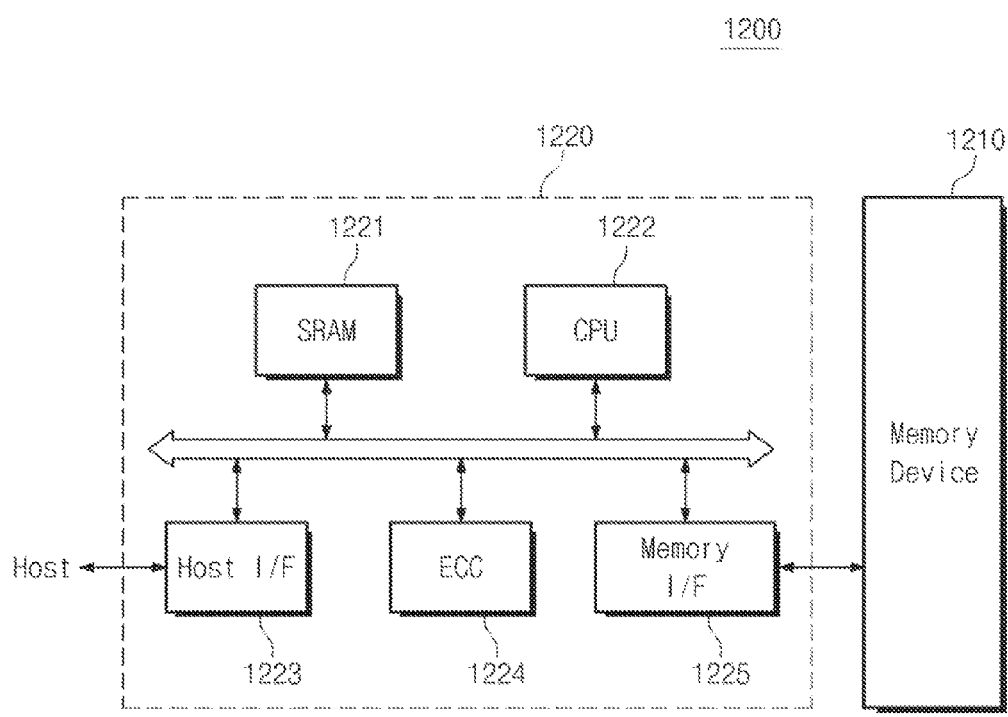
FIG. 10 is a block diagram showing an example of a memory card including a magnetic memory device according to example embodiments of the inventive concepts.

FIG. 10 is a block diagram briefly showing an example of a memory card including a magnetic memory device according to example embodiments of the inventive concepts.

Referring to FIG. 10, a memory card 1200 according to example embodiments of the inventive concepts includes a memory device 1210. The memory device 1210 may include at least one of magnetic memory devices disclosed in the above example embodiments. Also, the memory device 1210 may further include a different type of semiconductor memory device (e.g., a flash memory device, a phase-change memory device, a dynamic random access memory (DRAM), and/or a static random access memory (SRAM)). The memory card 1200 may include a memory controller 1220 controlling a data exchange between a host and the memory device 1210.

The memory controller 1220 may include a processing unit 1222 controlling entire operations of a memory card. Also, the memory controller 1220 may include an SRAM 1221 used as an operation memory of the processing unit 1222. The memory controller 1220 may further include a host interface 1223 and a memory interface 1225. The host interface 1223 may include a data exchange protocol between the memory card 1200 and host. The memory interface 1225 may contact the memory controller 1220 and the memory device 1210. The memory controller 1220 may further include an error correction block (Ecc) 1224. The error correction block 1224 may detect and correct an error read from the memory device 1210. Although not shown, the memory card 1200 may further include a read-only memory (ROM) device that stores code data for interfacing with host. The memory card 1200 may be used as portable data storage card. According to other example embodiments, the memory card 1200 may be implemented with a solid state disk (SSD), which may replace a hard disk in a computer system.

According to example embodiments of the inventive concepts, the reference cell for reading the memory cell can be easily formed. Also, the reference cells according to example embodiments of the inventive concepts can be used as a reference resistance without a pre-write.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:
1. A magnetic memory device, comprising:
at least one memory cell and a reference cell provided on a substrate,
wherein the at least one memory cell includes a first base magnetic layer, a free layer, and a first tunnel barrier layer between the first base magnetic layer and the free layer,
the reference cell includes a second base magnetic layer, a reference magnetic layer, and a second tunnel barrier layer between the second base magnetic layer and the reference magnetic layer; and
the reference magnetic layer has a magnetization direction substantially perpendicular to a magnetization direction of the free layer.

2. The magnetic memory device of claim 1, wherein the magnetization direction of the reference magnetic layer is fixed in a direction substantially perpendicular to a magnetization easy-axis of the free layer when a read current is applied to the reference cell.

3. The magnetic memory device of claim 1, wherein the first and second base magnetic layers have a magnetization direction substantially parallel with top surfaces of the first and second tunnel barrier layers, and
the free layer has a magnetization direction which changes to a direction parallel or anti-parallel with magnetization directions of the first and second base magnetic layers.

4. The magnetic memory device of claim 3, wherein the reference magnetic layer has a magnetization direction substantially perpendicular to the top surfaces of the first and second tunnel barrier layers.

5. The magnetic memory device of claim 3, wherein the reference magnetic layer includes the same material as the free layer, and is thinner than the free layer.

6. The magnetic memory device of claim 3, wherein the reference cell includes a non-magnetic metal oxide layer in contact with the reference magnetic layer.

7. The magnetic memory device of claim 6, wherein the reference magnetic layer and the free layer have the substantially same thickness.

8. The magnetic memory device of claim 6, wherein the non-magnetic metal oxide layer includes a nano-oxide layer having a thickness less than the second tunnel barrier layer.

9. The magnetic memory device of claim 6, wherein the reference magnetic layer is provided below the second base magnetic layer,
the reference cell includes a seed layer below the reference magnetic layer, and
the non-magnetic metal oxide layer is provided between the seed layer and reference magnetic layer.

10. The magnetic memory device of claim 1, wherein the first and second base magnetic layers have magnetization directions substantially perpendicular to top surfaces of the first and second tunnel barrier layers, and
the free layer has a magnetization direction which changes to a direction parallel or anti-parallel with magnetization directions of the first and second base magnetic layers.

11. The magnetic memory device of claim 10, wherein the reference magnetic layer has a magnetization direction substantially parallel to the top surfaces of the first and second tunnel barrier layers.

12. The magnetic memory device of claim 10, wherein the reference magnetic layer is thicker than the free layer.

13. The magnetic memory device of claim 10, wherein the at least one memory cell includes a non-magnetic metal oxide layer in contact with the free layer.

14. The magnetic memory device of claim 1, wherein the reference cell is disposed on the at least one memory cell.

* * * * *